United States Patent
Hamanaka et al.

(10) Patent No.: US 11,751,488 B2
(45) Date of Patent: Sep. 5, 2023

(54) SPIN ELEMENT AND RESERVOIR ELEMENT

(71) Applicant: TDK CORPORATION, Tokyo (JP)

(72) Inventors: Kosuke Hamanaka, Tokyo (JP); Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 503 days.

(21) Appl. No.: 16/981,310

(22) PCT Filed: Jan. 24, 2020

(86) PCT No.: PCT/JP2020/002513
§ 371 (c)(1),
(2) Date: Sep. 16, 2020

(87) PCT Pub. No.: WO2021/149242
PCT Pub. Date: Jul. 29, 2021

(65) Prior Publication Data
US 2022/0406993 A1 Dec. 22, 2022

(51) Int. Cl.
*H10N 52/80* (2023.01)
*H10B 61/00* (2023.01)
(Continued)

(52) U.S. Cl.
CPC ............. *H10N 52/80* (2023.02); *H10B 61/00* (2023.02); *H10N 50/85* (2023.02); *H10N 52/00* (2023.02)

(58) Field of Classification Search
CPC ........ H10N 52/80; H10N 50/85; H10N 52/00; H10B 61/00
(Continued)

(56) References Cited

U.S. PATENT DOCUMENTS 5,432,373 A * 7/1995 Johnson .............. G11C 11/1673
324/252
8,350,347 B2 1/2013 Gaudin et al.
(Continued)

FOREIGN PATENT DOCUMENTS

CN 1783334 A 6/2006
JP 2005-056976 A 3/2005
(Continued)

OTHER PUBLICATIONS

Kato et al.; "Observation of the Spin Hall Effect in Semiconductors"; Science; vol. 306; 2004; pp. 1910-1913.
(Continued)

*Primary Examiner* — Jami Valentine Miller
(74) *Attorney, Agent, or Firm* — Oliff PLC

(57) ABSTRACT

A spin element according to the present embodiment includes a wiring, a laminate including a first ferromagnetic layer laminated on the wiring, a first conductive part and a second conductive part with the first ferromagnetic layer therebetween in a plan view in a lamination direction, and an intermediate layer which is in contact with the wiring and is between the first conductive part and the wiring, wherein a diffusion coefficient of a second element including the intermediate layer with respect to a first element including the wiring is smaller than a diffusion coefficient of a third element constituting the first conductive part with respect to the first element or a diffusion coefficient of the third element including the first conductive part with respect to the second element constituting the wiring is smaller than a diffusion coefficient of the third element with respect to the first element constituting the intermediate layer.

20 Claims, 7 Drawing Sheets

(51) Int. Cl.
H10N 50/85 (2023.01)
H10N 52/00 (2023.01)

(58) Field of Classification Search
USPC .......................................................... 257/421
See application file for complete search history.

(56) References Cited

U.S. PATENT DOCUMENTS

| | | | |
|---|---|---|---|
| 2006/0114714 | A1 | 6/2006 | Kanegae |
| 2006/0197128 | A1* | 9/2006 | Osipov .................. H01F 1/405 |
| | | | 257/295 |
| 2011/0129691 | A1 | 6/2011 | Ishiwata et al. |
| 2012/0056254 | A1* | 3/2012 | Sasaki ................. G11C 11/1675 |
| | | | 257/295 |
| 2015/0348606 | A1 | 12/2015 | Buhrman et al. |
| 2016/0020207 | A1 | 1/2016 | Tsuchiya et al. |
| 2017/0178705 | A1 | 6/2017 | Buhrman et al. |
| 2017/0222135 | A1 | 8/2017 | Fukami et al. |
| 2019/0189516 | A1 | 6/2019 | Sasaki et al. |

FOREIGN PATENT DOCUMENTS

| | | |
|---|---|---|
| JP | 5441005 B2 | 3/2014 |
| JP | 2016-021530 A | 2/2016 |
| JP | 2017-216286 A | 12/2017 |
| JP | 6620915 B1 | 12/2019 |
| WO | 2016/021468 A1 | 2/2016 |
| WO | 2018/189964 A1 | 10/2018 |
| WO | 2019/171715 A1 | 9/2019 |

OTHER PUBLICATIONS

Miron et al.; "Perpendicular switching of a single ferromagnetic layer induced by in-plane current injection"; Nature; vol. 476; 2011; pp. 189-194.

Liu et al.; "Spin torque switching with the giant spin Hall effect of tantalum"; Science; vol. 336; 2012; pp. 1-12.

Liu et al.; "Current-Induced Switching of Perpendicularly Magnetized Magnetic Layers Using Spin Torque from the Spin Hall Effect"; Physical Review Letters; vol. 109; 2012; pp. 096602-1 to 096602-5.

Lee et al.; "Threshold current for switching of a perpendicular magnetic layer induced by spin Hall effect"; Applied Physics Letters; vol. 102; 2013; pp. 1-17.

Lee et al.; "Thermally activated switching of perpendicular magnet by spin-orbit spin torque"; Applied Physics Letters; vol. 104; 2014; pp. 072413-1 to 072413-5.

Fukami et al.; "Magnetization switching by spin-orbit torque in an antiferromagnet-ferromagnet bilayer system"; Nature Materials; vol. 15; 2016; pp. 535-542.

Fukami et al.; "A spin-orbit torque switching scheme with collinear magnetic easy axis and current configuration" Nature Nanotechnology; vol. 11; 2016; pp. 1-6.

Takahashi et al.; "Spin injection and detection in magnetic nanostructures"; Physical Review B vol. 67; 2003; pp. 052409-1 to 052409-4.

Seo et al.; "Area-Efficient SOT-MRAM With a Schottky Diode"; IEEE Electron Device Letters; vol. 37; 2016; pp. 982-985.

Zhang et al.; "Spin Hall Effects in Metallic Antiferromagnets"; Physical Review Letters; vol. 113; 2014; pp. 196602-1 to 196602-6.

* cited by examiner

SPIN ELEMENT AND RESERVOIR ELEMENT

FIELD

The present invention relates to a spin element and a reservoir element.

BACKGROUND

Next generation non-volatile memories have been focused on instead of flash memories and the like which have reached the limit of miniaturization. For example, a magnetoresistive random access memory (MRAM), a resistance random access memory (ReRAM), a phase change random access memory (PCRAM) and the like are known as next generation non-volatile memories.

An MRAM is a memory element using a magnetoresistance effect element. A resistance value of the magnetoresistance effect element changes depending on a difference in the relative angle of directions of the magnetizations of two magnetic films. The MRAM records the resistance value of the magnetoresistance effect element as data.

Among spin elements using magnetoresistance change, a spin orbit torque type magnetoresistance effect element using a spin orbit torque (SOT) (for example, Patent Document 1) and a magnetic domain wall moving type magnetic recording element using movement of a magnetic domain wall (for example, Patent Document 2) have been focused on. These spin elements are connected to a semiconductor element such as a transistor via a wiring and controlled. For example, Patent Document 3 describes that a barrier metal film is formed on a wiring in a semiconductor device so that the electromigration resistance of the wiring increases.

CITATION LIST

Patent Literature

[Patent Document 1]
Japanese Unexamined Patent Application, First Publication No. 2017-216286
[Patent Document 2]
Japanese Patent No. 5441005
[Patent Document 3]
Japanese Unexamined Patent Application, First Publication No. 2016-21530

SUMMARY

Technical Problem

The material of a wiring used for a spin element may be limited. For example, in the case of a spin orbit torque type magnetoresistance effect element, in order to inject many spins into a ferromagnetic layer, a heavy metal may be used for the wiring. In addition, for example, in the case of a magnetic domain wall moving type magnetic recording element, the wiring needs to be a magnetic film. Therefore, the material of the wiring constituting the spin element and the material of the wiring that connects together elements are different from each other and a potential concentrates at the connection part between them. The local concentration of the potential causes deterioration of the wiring.

The present invention has been made in view of the above problems, and an object of the present invention is to provide a spin element and a reservoir element in which diffusion of elements between different materials is reduced and deterioration of a wiring is minimized.

Solution to Problem (1) A spin element according to a first aspect includes a wiring; a laminate including a first ferromagnetic layer laminated on the wiring; a first conductive part and a second conductive part with the first ferromagnetic layer therebetween in a plan view in a lamination direction; and a first intermediate layer which is in contact with the wiring and is between the first conductive part and the wiring, wherein a diffusion coefficient of a second element including the first intermediate layer with respect to a first element including the wiring is smaller than a diffusion coefficient of a third element including the first conductive part with respect to the first element, or a diffusion coefficient of the second element with respect to the first element is smaller than a diffusion coefficient of the third element with respect to the first element.

(2) In the spin element according to the above aspect, the first element, the second element and the third element may be elements that are different from each other, the first element may be one selected from the group consisting of Au, Hf, Mo, Pt, W, and Ta, the second element may be one selected from the group consisting of Co, Al, Ag, Au, Mo, Hf, Pt, W, and Ta, and the third element may be one selected from the group consisting of Ag, Cu, Co, Al, and Au.

(3) A spin element according to a second aspect includes a wiring; a laminate including a first ferromagnetic layer laminated on the wiring; a first conductive part and a second conductive part with the first ferromagnetic layer therebetween in a plan view in a lamination direction; and a first intermediate layer which is in contact with the wiring between the first conductive part and the wiring, wherein the wiring contains one selected from the group consisting of Au, Hf, Mo, Pt, W, and Ta as a first element, wherein the first intermediate layer contains a second element, wherein the first conductive part contains a third element, and wherein the first element, the second element, and the third element are predetermined elements.

(4) In the spin element according to the above aspect, a circumferential length of the first intermediate layer may be smaller than a circumferential length of the first conductive part, and, in a plan view in the lamination direction, the first intermediate layer may be included in the first conductive part.

(5) In the spin element according to the above aspect, the circumferential length of the first intermediate layer may be smaller than the circumferential length of the first conductive part, and, in a plan view in the lamination direction, a geometrical center of the first intermediate layer may be closer to the first ferromagnetic layer than a geometrical center of the first conductive part.

(6) In the spin element according to the above aspect, a side surface of the first intermediate layer and a side surface of the first conductive part may be continuous.

(7) In the spin element according to the above aspect, the wiring may have a circumferential length that increases from a first surface on the side of the first ferromagnetic layer toward a second surface opposite to the first surface.

(8) In a second direction orthogonal to a first direction in which the wiring extends and the lamination direction of the spin element according to the above aspect, a width of the wiring may be narrower than a width of the first intermediate layer in the second direction.

(9) In the spin element according to the above aspect, a second intermediate layer which is in contact with the wiring and is between the second conductive part and the wiring, and a diffusion coefficient of a fifth element including the second intermediate layer with respect to the first element may be smaller than a diffusion coefficient of a fourth element including the second conductive part with respect to the first element, or a diffusion coefficient of the fourth element with respect to the fifth element may be smaller than a diffusion coefficient of the fourth element with respect to the first element.

(10) In the spin element according to the above aspect, the laminate may include the first ferromagnetic layer, and the wiring may be any one of a metal, an alloy, an intermetallic compound, a metal boride, a metal carbide, a metal silicide, and a metal phosphide which have a function of generating a spin current due to the spin Hall effect when a current flows.

(11) In the spin element according to the above aspect, the laminate may include the first ferromagnetic layer, a nonmagnetic layer, and a second ferromagnetic layer from the side closer to the wiring, and the wiring may be any one of a metal, an alloy, an intermetallic compound, a metal boride, a metal carbide, a metal silicide, and a metal phosphide which have a function of generating a spin current due to the spin Hall effect when a current flows.

(12) In the spin element according to the above aspect, a shortest distance between the first intermediate layer and the first ferromagnetic layer may be 5 times a spin diffusion length of the first element or less.

(13) In the spin element according to the above aspect, plus or minus signs of spin Hall angles of the first element and the second element may be the same.

(14) In the spin element according to the above aspect, the laminate may contain a nonmagnetic layer and the first ferromagnetic layer from the side closer to the wiring, and the wiring may be a ferromagnetic layer that is capable of having a magnetic domain wall therein.

(15) A reservoir element according to a third aspect includes a plurality of spin elements according to the above aspect and a spin conduction layer that connects between the first ferromagnetic layers of the plurality of spin elements.

Advantageous Effects of Invention

In the spin element and the reservoir element according to the above aspects, the wiring does not easily deteriorate.

DESCRIPTION OF EMBODIMENTS

Figure 1:
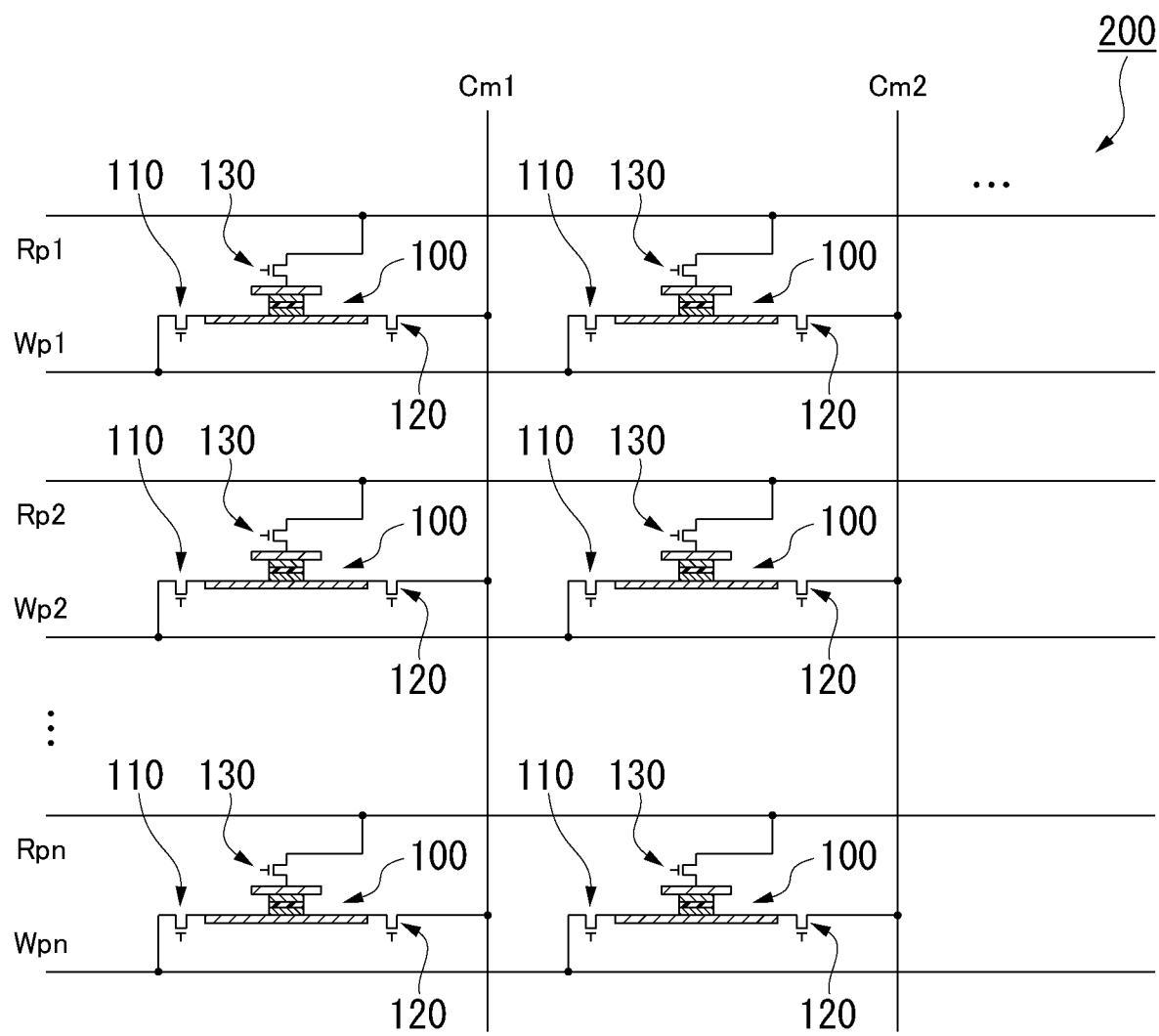
FIG. 1 is a schematic view of a magnetic recording array according to a first embodiment.

The present embodiment will be appropriately described below in detail with reference to the drawings. In the drawings used in the following description, in order to facilitate understanding of features of the present invention, feature parts are enlarged for convenience of illustration in some cases, and size ratios and the like between components may be different from actual components. Materials, sizes, and the like in the following description are exemplary examples not limiting the present invention, and they can be appropriately changed within a range in which effects of the present invention are obtained.

First, directions will be defined. One direction of one surface of a substrate Sub (refer to FIG. 2) to be described below is defined as an x direction, and a direction orthogonal to the x direction is defined as a y direction. The x direction is a direction in which a wiring 20 to be described below extends and is a length direction of the wiring 20. The x direction is an example of a first direction. The y direction is an example of a second direction. The z direction is a direction orthogonal to the x direction and the y direction. The z direction is an example of a lamination direction. Hereinafter, the +z direction may be expressed as "upward" and the −z direction may be expressed as "downward." Upward and downward may not always be aligned with the direction of gravity.

For example, "extend in the x direction" in this specification means that the size in the x direction is larger than the smallest size in the x direction, the y direction, and the z direction. The same applies to extension in other directions.

First Embodiment

FIG. 1 is a configuration diagram of a magnetic recording array 200 according to a first embodiment. The magnetic recording array 200 includes a plurality of magnetoresistance effect elements 100, a plurality of write wirings Wp1 to Wpn, a plurality of common wirings Cm1 to Cmn, a plurality of read wirings Rp1 to Rpn, a plurality of first switching elements 110, a plurality of second switching elements 120, and a plurality of third switching elements 130. The magnetic recording array 200 can be used, for example, in a magnetic memory. The magnetoresistance effect element 100 is an example of a spin element.

Each of the write wirings Wp1 to Wpn electrically connects a power supply to one or more magnetoresistance effect elements 100. The common wirings Cm1 to Cmn are wirings used both during writing and reading of data. Each of the common wirings Cm1 to Cmn electrically connects a reference potential to one or more magnetoresistance effect elements 100. The reference potential is, for example, the ground. Each of the common wirings Cm1 to Cmn may be arranged in each of the plurality of magnetoresistance effect elements 100, and may be arranged for a plurality of magnetoresistance effect elements 100. Each of the read wirings Rp1 to Rpn electrically connects a power supply to one or more magnetoresistance effect elements 100. The power supply is connected to the magnetic recording array 200 during use.

The first switching element 110, the second switching element 120, and the third switching element 130 shown in FIG. 1 are connected to respective magnetoresistance effect elements 100. The first switching element 110 is connected between the magnetoresistance effect element 100 and each of the write wirings Wp1 to Wpn. The second switching element 120 is connected between the magnetoresistance effect element 100 and each of the common wirings Cm1 to Cmn. The third switching element 130 is connected between the magnetoresistance effect element 100 and each of the read wirings Rp1 to Rpn.

When the first switching element 110 and the second switching element 120 are turned ON, a write current flows between the write wiring Wp1 to Wpn and the common wiring Cm1 to Cmn which are connected to the predetermined magnetoresistance effect element 100. When the second switching element 120 and the third switching element 130 are turned ON, a read current flows between the common wiring Cm1 to Cmn and the read wiring Rp1 to Rpn which are connected to the predetermined magnetoresistance effect element 100.

The first switching element 110, the second switching element 120 and the third switching element 130 are elements that control a flow of a current. The first switching element 110, the second switching element 120 and the third switching element 130 are, for example, a transistor, an element using a phase change of a crystal layer such as an ovonic threshold switch (OTS), an element using a change in band structure such as a metal insulator transition (MIT) switch, an element using a breakdown voltage such as a Zener diode and an avalanche diode, or an element of which conductivity changes as the atomic position changes.

One of the first switching element 110, the second switching element 120, and the third switching element 130 may be shared with the magnetoresistance effect elements 100 connected to the same wiring. For example, when the first switching element 110 is shared, one first switching element 110 is disposed upstream from each of the write wirings Wp1 to Wpn. For example, when the second switching element 120 is shared, one second switching element 120 is disposed upstream from each of the common wirings Cm1 to Cmn. For example, when the third switching element 130 is shared, one third switching element 130 is disposed upstream from each of the read wirings Rp1 to Rpn.

Figure 2:
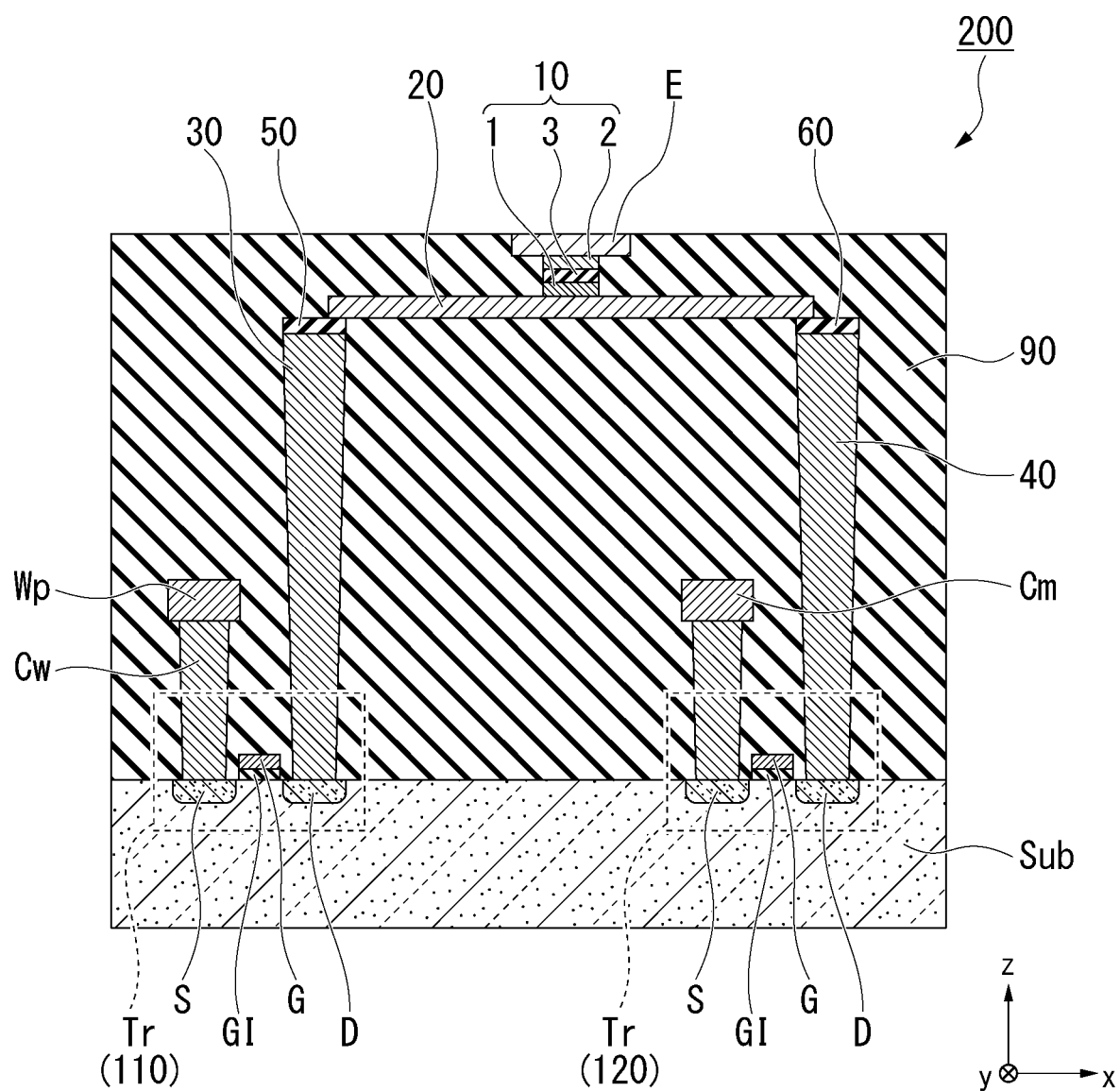
FIG. 2 is a cross-sectional view of feature parts of the magnetic recording array according to the first embodiment.

FIG. 2 is a cross-sectional view of main parts of the magnetic recording array 200 according to the first embodiment. FIG. 2 shows a cross section of the magnetoresistance effect element 100 cut along an xz plane that passes through the center of the width of the wiring 20 to be described below in the y direction.

The first switching element 110 and the second switching element 120 shown in FIG. 2 are transistors Tr. The third switching element 130 is electrically connected to a conductive layer E, and is positioned, for example, in the y direction in FIG. 2. The transistor Tr is, for example, a field-effect transistor, and includes a gate electrode G, a gate insulation film GI, and a source S and a drain D formed on the substrate Sub. The substrate Sub is, for example, a semiconductor substrate.

The transistor Tr and the magnetoresistance effect element 100 are electrically connected via a first conductive part 30 and a first intermediate layer 50 or via a second conductive part 40 and a second intermediate layer 60. In addition, the transistor Tr and the write wiring Wp or the common wiring Cm are connected via a conductive part Cw. The first conductive part 30, the second conductive part 40 and the conductive part Cw may be referred to as, for example, a connection wiring or a via wiring. The first conductive part 30, the second conductive part 40 and the conductive part Cw extend, for example, in the z direction.

The circumference of the magnetoresistance effect element 100 and the transistor Tr is covered with an insulating layer 90. The insulating layer 90 is an insulating layer that insulates between wirings of multi-layer wirings and between elements. The insulating layer 90 is made of, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), or zirconium oxide ($ZrO_x$).

Figure 3:
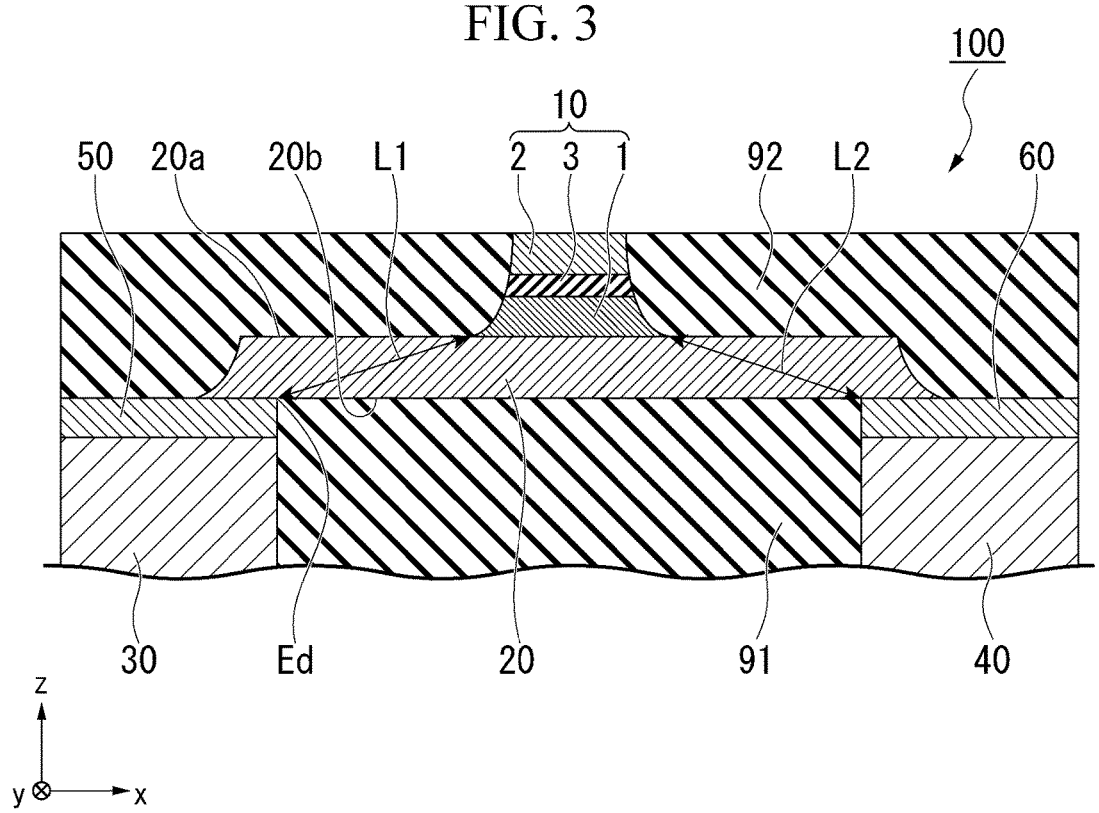
FIG. 3 is a cross-sectional view of a spin element according to the first embodiment.
Figure 4:
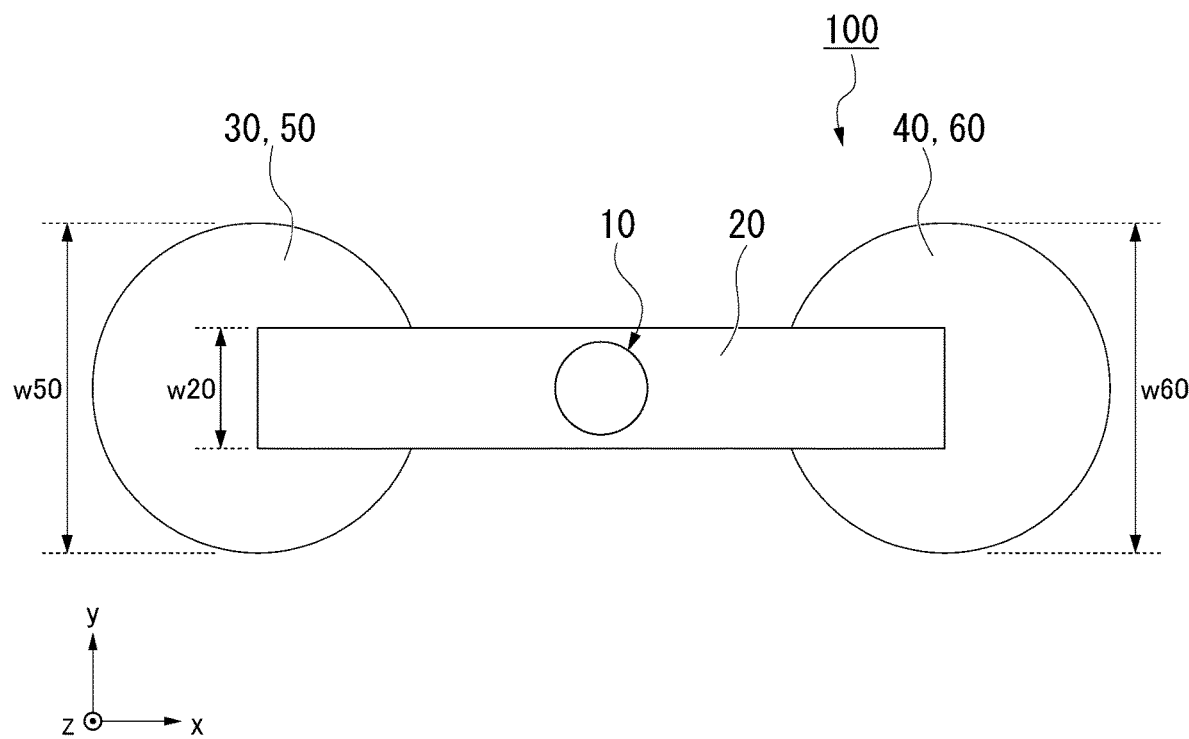
FIG. 4 is a plan view of the spin element according to the first embodiment.

FIG. 3 is a cross-sectional view of the magnetoresistance effect element 100 according to the first embodiment. FIG. 4 is a plan view of the magnetoresistance effect element 100 according to the first embodiment. FIG. 3 shows a cross section of the magnetoresistance effect element 100 cut along an xz plane that passes through the center of the width of the wiring 20 in the y direction.

The magnetoresistance effect element 100 includes a laminate 10, the wiring 20, the first conductive part 30, the second conductive part 40, the first intermediate layer 50, and the second intermediate layer 60. An insulating layer 91 and an insulating layer 92 are a part of the insulating layer 90. The resistance value of the laminate 10 in the z direction changes when a spin is injected from the wiring 20 into the laminate 10. The magnetoresistance effect element 100 is a spin element using a spin orbit torque (SOT), and may be referred to as a spin orbit torque type magnetoresistance effect element, a spin injection type magnetoresistance effect element, or a spin current magnetoresistance effect element. In addition, the wiring 20 may be referred to as a spin orbit torque wiring.

The laminate 10 is laminated on the wiring 20. Another layer may be disposed between the laminate 10 and the wiring 20. The laminate 10 is interposed between the wiring 20 and the conductive layer E in the z direction. The laminate 10 is a columnar component. The shape of the laminate 10 in a plan view in the z direction is, for example, a circular shape, an elliptical shape or a rectangular shape.

The laminate 10 includes a first ferromagnetic layer 1, a second ferromagnetic layer 2, and a nonmagnetic layer 3. For example, the first ferromagnetic layer 1 is in contact with the wiring 20 and is laminated on the wiring 20. A spin is injected from the wiring 20 into the first ferromagnetic layer 1. The magnetization of the first ferromagnetic layer 1 receives a spin orbit torque (SOT) and the orientation direction changes due to the injected spin. The second ferromagnetic layer 2 is in the z direction of the first ferromagnetic layer 1. The nonmagnetic layer 3 is inserted between the first ferromagnetic layer 1 and the second ferromagnetic layer 2 in the z direction.

The first ferromagnetic layer 1 and the second ferromagnetic layer 2 each have a magnetization. The orientation direction of the magnetization of the second ferromagnetic layer 2 is less likely to change than the magnetization of the first ferromagnetic layer 1 when a predetermined external force is applied. The first ferromagnetic layer 1 may be called a magnetization free layer, and the second ferromagnetic layer 2 may be called a magnetization fixed layer or a magnetization reference layer. The resistance value of the laminate 10 changes according to a difference in the relative angle between the magnetizations of the first ferromagnetic layer 1 and the second ferromagnetic layer 2 with the nonmagnetic layer 3 therebetween.

The first ferromagnetic layer 1 and the second ferromagnetic layer 2 contain a ferromagnetic material. Examples of ferromagnetic materials include a metal selected from the group consisting of Cr, Mn, Co, Fe and Ni, an alloy containing one or more of these metals, and an alloy containing such a metal and at least one or more elements of B, C, and N. The ferromagnetic material is, for example, a Co—Fe, Co—Fe—B, Ni—Fe or Co—Ho alloy, an Sm—Fe alloy, an Fe—Pt alloy, a Co—Pt alloy, or a CoCrPt alloy.

The first ferromagnetic layer 1 and the second ferromagnetic layer 2 may contain a Heusler alloy. A Heusler alloy contains an intermetallic compound having a chemical composition of XYZ or $X_2YZ$. In the periodic table, X is a transition metal element from the Co, Fe, Ni, or Cu groups or a noble metal element, Y is a transition metal from the Mn, V, Cr or Ti groups or an element of type X, and Z is a typical element from Group III to Group V. Examples of Heusler alloys include $Co_2FeSi$, $Co_2FeGe$, $Co_2FeGa$, $Co_2MnSi$, $Co_2Mn_{1-a}Fe_aAl_bSi_{1-b}$, and $Co_2FeGe_{1-c}Ga_c$. Heusler alloys have high spin polarizability.

The laminate 10 may have an antiferromagnetic layer on the surface of the second ferromagnetic layer 2 opposite to the nonmagnetic layer 3 with a spacer layer therebetween. The second ferromagnetic layer 2, the spacer layer, and the antiferromagnetic layer have a synthetic antiferromagnetic structure (SAF structure). The synthetic antiferromagnetic structure is formed of two magnetic layers with a nonmagnetic layer therebetween. Due to antiferromagnetic coupling between the second ferromagnetic layer 2 and the antiferromagnetic layer, a coercive force of the second ferromagnetic layer 2 becomes larger compared to when there is no antiferromagnetic layer. The antiferromagnetic layer contains, for example, IrMn or PtMn. The spacer layer contains, for example, at least one selected from the group consisting of Ru, Ir, and Rh.

The laminate 10 may have a layer other than the first ferromagnetic layer 1, the second ferromagnetic layer 2 and the nonmagnetic layer 3. For example, an underlayer may be disposed between the wiring 20 and the laminate 10. The underlayer improves the crystallinity of respective layers constituting the laminate 10.

For example, the wiring 20 comes in contact with one surface of the laminate 10. The wiring 20 is a write wiring for writing data in the magnetoresistance effect element 100. The wiring 20 extends in the x direction. The first ferromagnetic layer 1 is inserted between at least a part of the wiring 20 and the nonmagnetic layer 3 in the z direction. For example, an area of a first surface 20a farther from the substrate Sub of the wiring 20 is smaller than an area of a second surface 20b opposite to the first surface 20a. For example, the wiring 20 has a circumferential length that increases from the first surface 20a toward the second surface 20b.

The wiring 20 causes a spin current to be generated due to the spin Hall effect when a current I flows, and a spin to be injected into the first ferromagnetic layer 1. The wiring 20 applies, for example, a spin orbit torque (SOT) with which the magnetization of the first ferromagnetic layer 1 can be reversed to the magnetization of the first ferromagnetic layer 1. The spin Hall effect is a phenomenon in which, when a current flows, a spin current is induced in a direction orthogonal to a direction in which the current flows based on a spin-orbit interaction. The spin Hall effect and a general Hall effect are the same in that mobile (moving) charges (electrons) are bent in the direction of motion (movement).

In the general Hall effect, a movement direction of charged particles that move in a magnetic field is bent due to a Lorentz force. On the other hand, in the spin Hall effect, a movement direction of a spin is bent only by movement of electrons (only when a current flows) without there being a magnetic field.

For example, when a current flows through the wiring 20, a first spin directed in one direction and a second spin directed in a direction opposite to that of the first spin are bent in the direction orthogonal to the direction in which the current I flows due to the spin Hall effect. For example, the first spin directed in the −y direction is bent in the +z direction and the second spin directed in the +y direction is bent in the −z direction.

The number of electrons with the first spin and the number of electrons with the second spin generated due to the spin Hall effect are the same in a nonmagnetic material (a material that is not a ferromagnetic material). That is, the number of electrons with the first spin in the +z direction and the number of electrons with the second spin in the −z direction are the same. The first spin and the second spin flow in a direction in which an uneven distribution of spins is eliminated. In movement of the first spin and the second spin in the z direction, flows of charge cancel each other out, and thus an amount of currents becomes zero. A spin current that occurs without this current is specifically called a pure spin current.

When a flow of electrons with the first spin is denoted as $J_\uparrow$, a flow of electrons with the second spin is denoted as $J_\downarrow$, and a spin current is denoted as $J_S$, $J_S=J_\uparrow−J_\downarrow$ is defined. The spin current $J_S$ occurs in the z direction. The first spin is injected into the first ferromagnetic layer 1 from the wiring 20.

The wiring 20 contains any of a metal, an alloy, an intermetallic compound, a metal boride, a metal carbide, a metal silicide, and a metal phosphide which have a function of generating a spin current due to the spin Hall effect when a current I flows.

The wiring 20 contains, for example, a nonmagnetic heavy metal as a main element. The main element is an element having the highest proportion among elements constituting the wiring 20. The main element constituting the wiring 20 is a first element.

For example, the first element is a heavy metal having a specific gravity that is equal to or higher than that of yttrium (Y). For example, the nonmagnetic heavy metal includes d electrons or f electrons in the outermost shell and has a large atomic number of 39 or more and causes a strong spin-orbit interaction. The spin Hall effect is caused by a spin-orbit interaction and spins are likely to be unevenly distributed in the wiring 20 and a spin current $J_S$ is easily generated. The first element is, for example, one selected from the group consisting of Au, Hf, Mo, Pt, W, and Ta.

The wiring 20 may contain a magnetic metal in addition to the first element. The magnetic metal is a ferromagnetic metal or an antiferromagnetic metal. A small amount of a magnetic metal contained in a nonmagnetic material serves as a spin scattering factor. The small amount is, for example, 3% or less of a total molar ratio of elements constituting the wiring 20. When spins are scattered by the magnetic metal, the spin-orbit interaction is enhanced, and the spin current generation efficiency for a current increases.

The wiring 20 may contain a topological insulator. The topological insulator is a substance which includes an insulator or a high resistance component therein and has a spin-polarized metallic state on its surface. In this topological insulator, an internal magnetic field is generated due to a spin-orbit interaction. In the topological insulator, a new topological phase is exhibited due to a spin-orbit interaction effect even if there is no external magnetic field. The topological insulator can generate a pure spin current with high efficiency due to a strong spin-orbit interaction and breaking of reversal symmetry at the edge.

The topological insulator is made of, for example, SnTe, $Bi_{1.5}Sb_{0.5}Te_{1.7}Se_{1.3}$, $TlBiSe_2$, $Bi_2Te_3$, $Bi_{1-x}Sb_x$, or $(Bi_{1-x}Sb_x)_2Te_3$. The topological insulator can generate a spin current with high efficiency.

The laminate 10 is inserted between the first conductive part 30 and the second conductive part 40 in the x direction in a plan view in the z direction. The first conductive part 30 and the second conductive part 40 are wirings that connect the magnetoresistance effect element 100 to the transistor Tr.

The first conductive part 30 and the second conductive part 40 are made of a material having excellent conductivity. The main element constituting the first conductive part 30 is a third element. The main element constituting the second conductive part 40 is a fourth element. The third element and the fourth element are, for example, one selected from the group consisting of Ag, Cu, Co, Al, and Au. The third element and the fourth element may be the same as or different from each other.

The first intermediate layer 50 is between the wiring 20 and the first conductive part 30. The second intermediate layer 60 is between the wiring 20 and the second conductive part 40. A side surface of the first intermediate layer 50 shown in FIG. 3 is continuous with a side surface of the first conductive part 30, and a side surface of the second intermediate layer 60 is continuous with a side surface of the second conductive part 40. For example, when the first conductive part 30 and the first intermediate layer 50 are formed in one opening opened in the insulating layer 91, these side surfaces are continuous.

The first intermediate layer 50 prevents diffusion of the third element from the first conductive part 30 into the wiring 20, and the second intermediate layer 60 prevents diffusion of the fourth element from the second conductive part 40 into the wiring 20. The first intermediate layer 50 and the second intermediate layer 60 are diffusion prevention layers that prevent diffusion of respective elements. The main element constituting the first intermediate layer 50 is a second element. The main element constituting the second intermediate layer 60 is a fifth element. The second element and the fifth element are, for example, one selected from the group consisting of Co, Al, Ag, Au, Mo, Hf, Pt, W, and Ta. The second element and the fifth element may be the same as or different from each other.

The second element satisfies a first relationship or a second relationship with respect to the first element and the third element in order to prevent diffusion of the third element into the wiring 20. The second element may satisfy both the first relationship and the second relationship.

The first relationship is that a diffusion coefficient of the second element with respect to the first element is smaller than a diffusion coefficient of the third element with respect to the first element. Here, "diffusion coefficient of the second element with respect to the first element" means a diffusion coefficient of the second element in a material composed of the first element. The same applies to other elements. When the magnetoresistance effect element does not include the first intermediate layer 50, the first conductive part 30 and the wiring 20 are in contact with each other. In this case, the third element diffuses into the wiring 20. On the other hand, in the magnetoresistance effect element 100 including the first intermediate layer 50, the first intermediate layer 50 and the wiring 20 are in contact with each other. The second element is less likely to diffuse into the wiring 20 than the third element. Therefore, when the first intermediate layer 50 is provided between the first conductive part 30 and the wiring 20, it is possible to reduce diffusion of the element into the wiring 20. In addition, a part connecting the first intermediate layer 50 and the wiring 20 has an edge Ed, and a current is likely to concentrate at the edge Ed. When the edge Ed is formed in the first intermediate layer 50 containing the second element that is unlikely to diffuse, diffusion of the element into the wiring 20 is further reduced.

Examples of a combination of the first element, the second element, and the third element that satisfy the first relationship include the following combinations. When the first element is Au and the third element is Cu, the second element is one selected from the group consisting of Ag, Co, and Hf. When the first element is Au and the third element is Ag, the second element is Co or Hf. When the first element is Au and the third element is Co, the second element is Hf. When the first element is Hf and the third element is Co, the second element is Al. When the first element is Mo and the third element is Co, the second element is W. When the first element is Pt and the third element is Al, the second element is one selected from the group consisting of Au, Ag, and Co. When the first element is Pt and the third element is Au, the second element is Ag or Co. When the first element is Pt and the third element is Ag, the second element is Co. When the first element is Ta and the third element is Al, the second element is Hf. When the first element is W and the third element is Co, the second element is one selected from the group consisting of Hf and Mo.

The combination of the first element, the second element, and the third element may be specifically the following combinations among the above combinations The first element is Pt, the second element is Au, and the third element is Al.

The first element is Pt, the second element is Ag, and the third element is Al.

The first element is Pt, the second element is Co, and the third element is Al.

The first element is W, the second element is Mo, and the third element is Co.

The second relationship is that a diffusion coefficient of the third element with respect to the second element is smaller than a diffusion coefficient of the third element with respect to the first element. That is, the amount of the third element diffused into the first intermediate layer 50 when the first conductive part 30 and the first intermediate layer 50 are in contact with each other is smaller than the amount of the third element diffused into the wiring 20 when the first conductive part 30 and the wiring 20 are in contact with each other. Therefore, when the first intermediate layer 50 is disposed between the first conductive part 30 and the wiring 20, it is possible to reduce the amount of the third element diffused.

Examples of a combination of the first element, the second element, and the third element that satisfy the second relationship include the following combinations. When the first element is Au and the third element is Ag, the second element is Pt. When the first element is Au and the third element is Co, the second element is one selected from the group consisting of Pt, Mo, and W. When the first element is Hf and the third element is Co, the second element is one selected from the group consisting of Au, Pt, Mo and W. When the first element is Mo and the third element is Co, the second element is W. When the first element is Pt and the third element is Al, the second element is Ta or Hf. When the first element is Pt and the third element is Co, the second element is Mo or W. When the first element is Ta and the third element is Al, the second element is Hf.

The combination of the first element, the second element, and the third element may be specifically the following combinations among the above combinations The first element is Pt, the second element is Ta, and the third element is Al.

The first element is Pt, the second element is Hf, and the third element is Al.

The first element is Pt, the second element is Mo, and the third element is Co.

The first element is Pt, the second element is W, and the third element is Co.

Similarly, in order to prevent diffusion of the fourth element into the wiring 20, the fifth element satisfies a third relationship or a fourth relationship with respect to the first element and the fourth element. The fifth element may satisfy both the third relationship and the fourth relationship.

The third relationship is that a diffusion coefficient of the fifth element with respect to the first element is smaller than a diffusion coefficient of the fourth element with respect to the first element. The fourth relationship is that a diffusion coefficient of the fourth element with respect to the fifth element is smaller than a diffusion coefficient of the fourth element with respect to the first element.

For example, a width w50 of the first intermediate layer 50 in the y direction and a width w60 of the second intermediate layer 60 in the y direction are wider than the width of the wiring 20 in the y direction. When a contact area between the wiring 20 and the first intermediate layer 50 or the second intermediate layer 60 increases, it is possible to minimize accumulation of heat at an interface between the first conductive part 30 and the first intermediate layer 50 and at an interface between the second conductive part 40 and the second intermediate layer 60. Heat promotes diffusion of the element. When heat at the interface is efficiently discharged, it is possible to minimize electromigration of the first conductive part 30 and the second conductive part 40.

A shortest distance L1 between the first intermediate layer 50 and the first ferromagnetic layer 1 is, for example, 5 times a spin diffusion length of the first element constituting the wiring 20 or less. A shortest distance L2 between the second intermediate layer 60 and the first ferromagnetic layer 1 also satisfies, for example, the same relationship. When the shortest distances L1 and L2 satisfy the above relationship, some of the spins generated in the first intermediate layer 50 or the second intermediate layer 60 reach the first ferromagnetic layer 1, and assist reversal of the magnetization of the first ferromagnetic layer 1. In order to inject spins in the same direction into the first ferromagnetic layer 1, for example, the plus or minus signs of spin Hall angles of the first element including the wiring 20 and the second element including the first intermediate layer 50 are the same. The plus or minus signs of spin Hall angles of the first element including the wiring 20 and the fifth element including the second intermediate layer 60 may be the same for the same reason.

Next, a method of producing the magnetoresistance effect element 100 will be described. The magnetoresistance effect element 100 is formed according to a step of laminating layers and a processing step of processing a part of each layer into a predetermined shape. The layers can be laminated using a sputtering method, a chemical vapor deposition (CVD) method, an electron beam evaporation method (EB evaporation method), an atomic laser deposition method, or the like. The layers can be processed using photolithography or the like.

First, impurities are doped at a predetermined position on the substrate Sub to form the source S and the drain D. Next, the gate insulation film GI and the gate electrode G are formed between the source S and the drain D. The source S, the drain D, the gate insulation film GI and the gate electrode G form the transistor Tr.

Next, the insulating layer 91 is formed so that the transistor Tr is covered. In addition, when an opening is formed in the insulating layer 91 and a conductor is filled into the opening, the first conductive part 30, the second conductive part 40, the first intermediate layer 50, the second intermediate layer 60 and the conductive part Cw are formed. The write wiring Wp and the common wiring Cm are formed when the insulating layer 91 is laminated to a predetermined thickness and a groove is then formed in the insulating layer 91 and a conductor is filled into the groove.

Next, the insulating layer 91, the surfaces of the first intermediate layer 50 and the second intermediate layer 60 are flattened by chemical mechanical polishing (CMP), and a wiring layer, a ferromagnetic layer, a nonmagnetic layer, and a ferromagnetic layer are laminated in this order. Next, the wiring layer is processed into a predetermined shape. The wiring layer is processed into a predetermined shape to form the wiring 20. Next, when a laminate formed on the wiring layer is processed into a predetermined shape to form the laminate 10, the magnetoresistance effect element 100 can be produced.

Next, operations of the magnetoresistance effect element 100 according to the first embodiment will be described. The magnetoresistance effect element 100 has a data write operation and a data read operation.

First, an operation of recording data in the magnetoresistance effect element 100 will be described. First, the first switching element 110 and the second switching element 120 connected to the magnetoresistance effect element 100 in which data is to be recorded are turned ON. When the first switching element 110 and the second switching element 120 are turned ON, a write current flows through the wiring 20. When a write current flows through the wiring 20, the spin Hall effect occurs and spins are injected into the first ferromagnetic layer 1. Spins injected into the first ferromagnetic layer 1 apply a spin orbit torque (SOT) to the magnetization of the first ferromagnetic layer 1 and change the orientation direction of the magnetization of the first ferromagnetic layer 1. When the flow direction of a current is reversed, since directions of spins injected into the first ferromagnetic layer 1 are reversed, the orientation direction of the magnetization can be freely controlled.

The resistance value of the laminate 10 in the lamination direction is small when the magnetization of the first ferromagnetic layer 1 and the magnetization of the second ferromagnetic layer 2 are parallel to each other and is large when the magnetization of the first ferromagnetic layer 1 and the magnetization of the second ferromagnetic layer 2 are anti-parallel. Data is recorded in the magnetoresistance effect element 100 as a resistance value of the laminate 10 in the lamination direction.

Next, an operation of reading data from the magnetoresistance effect element 100 will be described. First, the first switching element 110 or the second switching element 120 and the third switching element 130 connected to the magnetoresistance effect element 100 in which data is to be recorded are turned ON. When each switching element is set in this manner, a read current flows in the laminate 10 in the lamination direction. When the resistance value of the laminate 10 in the lamination direction differs according to Ohm's law, a voltage to be output differs. Therefore, for example, when the voltage of the laminate 10 in the lamination direction is read, data recorded in the magnetoresistance effect element 100 can be read.

As described above, in the magnetoresistance effect element 100 according to the first embodiment, when the first element, the second element and the third element constituting respective parts satisfy a predetermined relationship (the first relationship or the second relationship), it is possible to reduce diffusion of elements into different layers. Elements diffused into other layers collide with electrons when a current is applied, which cause electromigration. When diffusion of the element is reduced, deterioration of the first conductive part 30 and the second conductive part 40 is minimized.

While an exemplary example of the first embodiment has been provided above, the present invention is not limited to the example.

Figure 5:
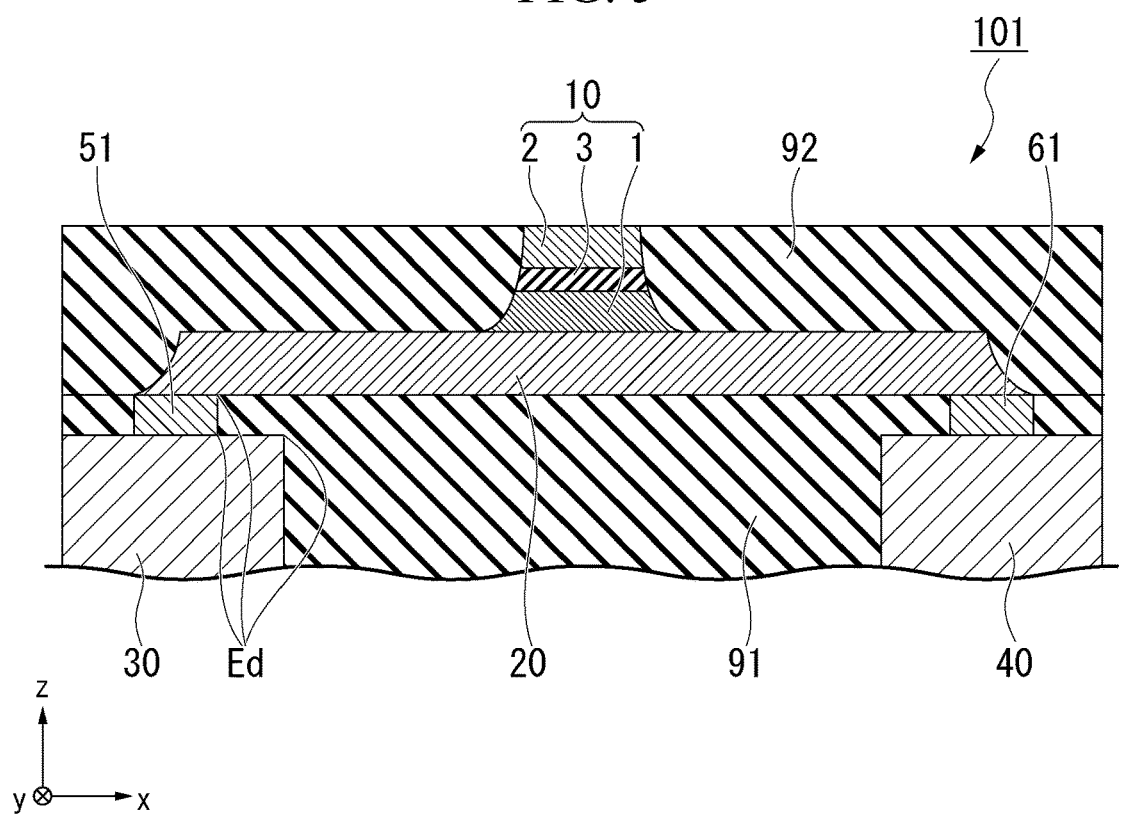
FIG. 5 is a cross-sectional view of a spin element according to a first modified example.
Figure 6:
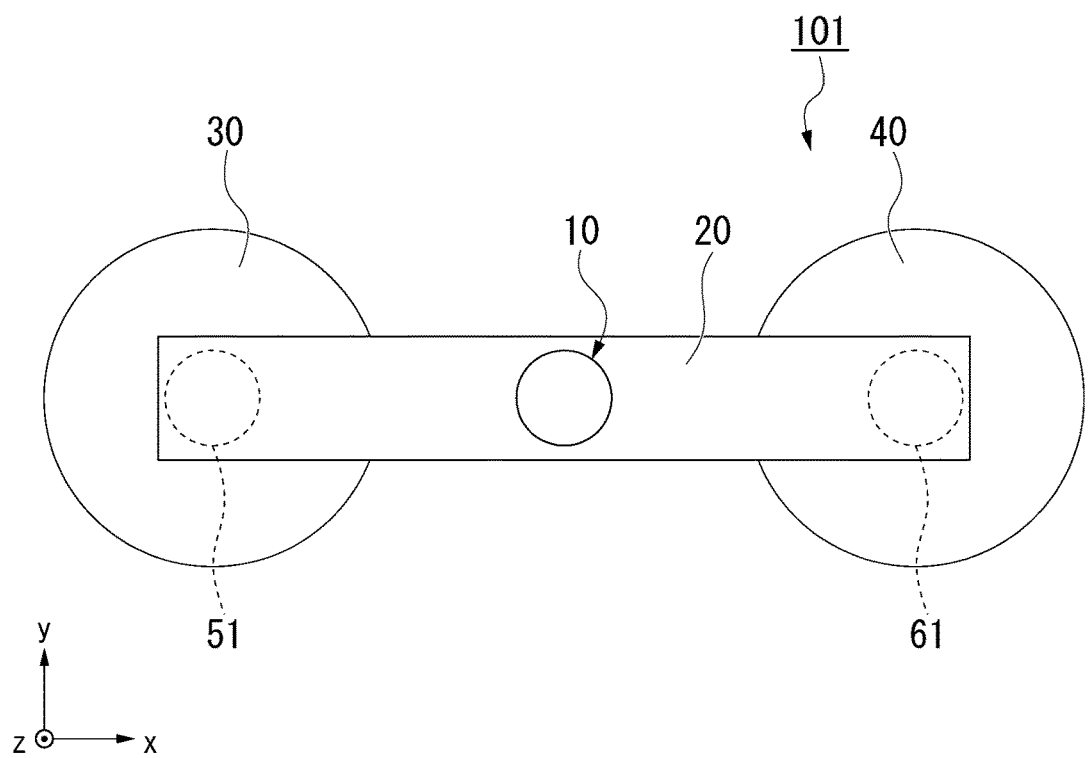
FIG. 6 is a plan view of the spin element according to the first modified example.

FIG. 5 is a cross-sectional view of a magnetoresistance effect element 101 according to a first modified example. FIG. 6 is a plan view of the magnetoresistance effect element 101 according to the first modified example. FIG. 5 shows a cross section of the magnetoresistance effect element 101 cut along an xz plane that passes through the center of the width of the wiring 20 in the y direction.

The magnetoresistance effect element 101 according to the first modified example is different from the magnetoresistance effect element 100 according to the first embodiment in that a side surface of a first intermediate layer 51 and a side surface of the first conductive part 30 are discontinuous, and a side surface of a second intermediate layer 61 and a side surface of the second conductive part 40 are discontinuous. The same components as those of the magnetoresistance effect element 100 will be denoted with the same reference numerals and descriptions thereof will be omitted.

The circumferential length of the first intermediate layer 51 is smaller than that of the first conductive part 30, and the circumferential length of the second intermediate layer 61 is smaller than that of the second conductive part 40. In a plan view in the z direction, the first intermediate layer 51 is included in the first conductive part 30, and the second intermediate layer 61 is included in the second conductive part 40. Since the first conductive part 30 and the second conductive part 40 are connected to the transistor Tr, the size is from the micron order to millimeter order. On the other hand, the laminate 10 has a nanosize to a micronsize. Since the first intermediate layer 51 and the second intermediate layer 61 are smaller than the first conductive part 30 and the second conductive part 40, respectively, it is easy to adjust a difference between the sizes thereof. In addition, since there are a plurality of edges Ed at which a current is likely to concentrate, it is possible to prevent a current from locally concentrating at one location.

Figure 7:
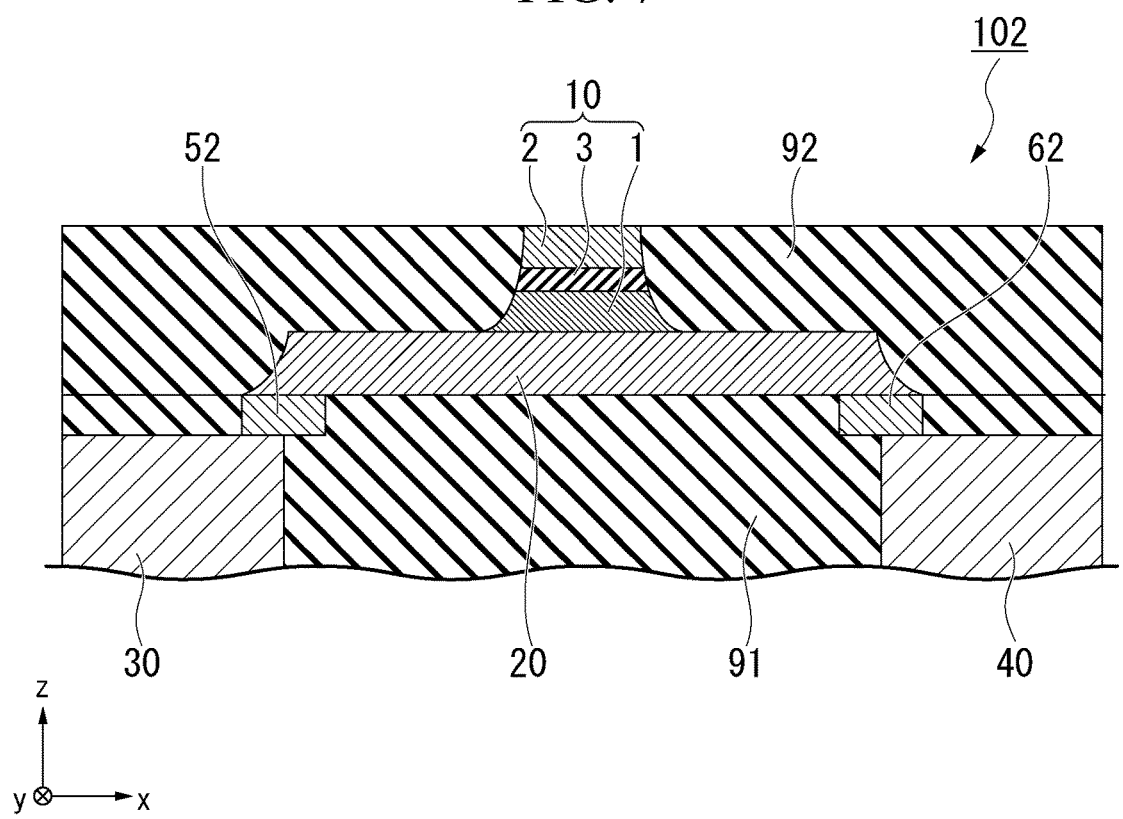
FIG. 7 is a cross-sectional view of a spin element according to a second modified example.
Figure 8:
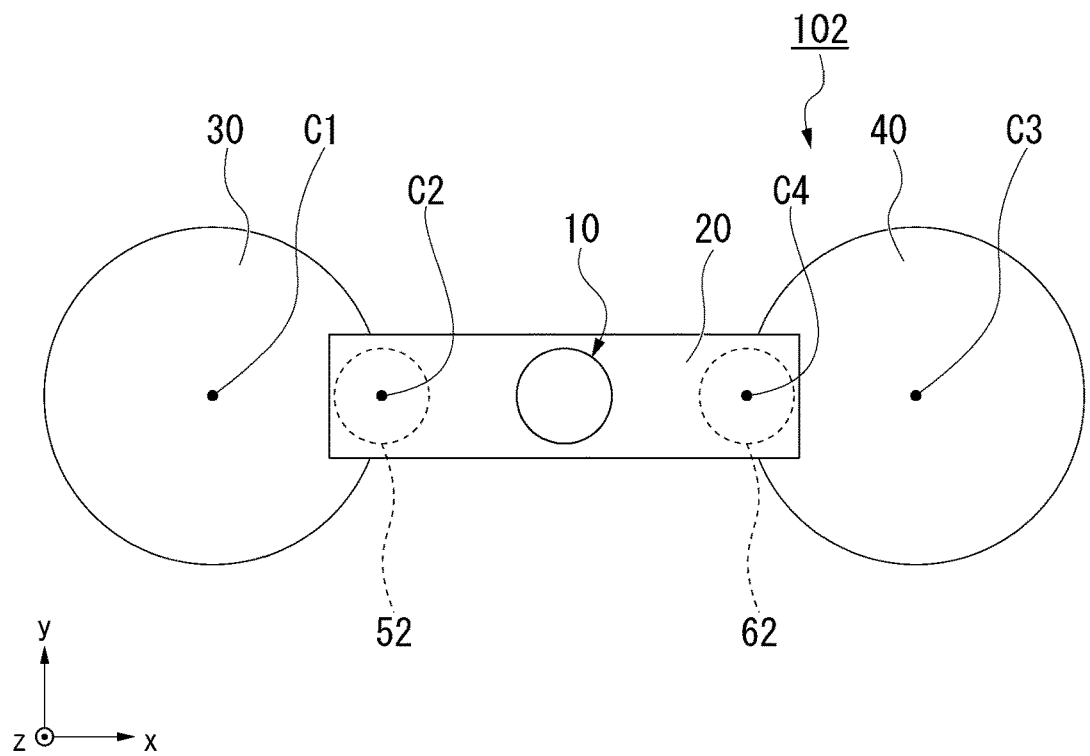
FIG. 8 is a plan view of the spin element according to the second modified example.

FIG. 7 is a cross-sectional view of a magnetoresistance effect element 102 according to a second modified example. FIG. 8 is a plan view of the magnetoresistance effect element 102 according to the second modified example. FIG. 7 shows a cross section of the magnetoresistance effect element 102 cut along an xz plane that passes through the center of the width of the wiring 20 in the y direction.

The magnetoresistance effect element 102 according to the second modified example is different from the magnetoresistance effect element 101 according to the first modified example in that a center C1 of the first conductive part 30 is displaced from a center C2 of a first intermediate layer 52, and a center C3 of the second conductive part 40 is displaced from a center C4 of a second intermediate layer 62. The same components as those of the magnetoresistance effect element 101 will be denoted with the same reference numerals and descriptions thereof will be omitted. Here, while the laminate 10, the first conductive part 30, the first intermediate layer 52, the second conductive part 40, and the second intermediate layer 62 which have a circular shape in a plan view have been exemplified above, if the shape is not circular, "center" is read as "geometrical center."

The circumferential length of the first intermediate layer 52 is smaller than that of the first conductive part 30, and the circumferential length of the second intermediate layer 62 is smaller than that of the second conductive part 40. In the z direction, the center C2 of the first intermediate layer 52 is closer to the laminate 10 than the center C1 of the first conductive part 30, and the center C4 of the second intermediate layer 62 is closer to the laminate 10 than the center C3 of the second conductive part 40. The distance between the center C2 of the first intermediate layer 52 and the center of the laminate is shorter than the distance between the center C1 of the first conductive part 30 and the center of the laminate 10. The distance between the center C4 of the second intermediate layer 62 and the center of the laminate is shorter than the distance between the center C3 of the second conductive part 40 and the center of the laminate 10.

Since the first conductive part 30 and the second conductive part 40 are connected to the transistor Tr, it is not possible to freely change a distance between the first conductive part 30 and the second conductive part 40. For example, the minimum processing size (feature size) of the transistor Tr is defined, and it is difficult to make the distance between the first conductive part 30 and the second conductive part 40 close to the minimum processing size or less. The first intermediate layer 52 and the second intermediate layer 62 are different layers from the transistor Tr, and the positional relationship can be freely changed. When the first intermediate layer 51 and the second intermediate layer 62 are brought close to the laminate 10, the length of the wiring 20 is shortened. The wiring 20 contains a heavy metal and easily generates heat. When a heat source is reduced, diffusion of elements into other layers can be further reduced.

Figure 9:
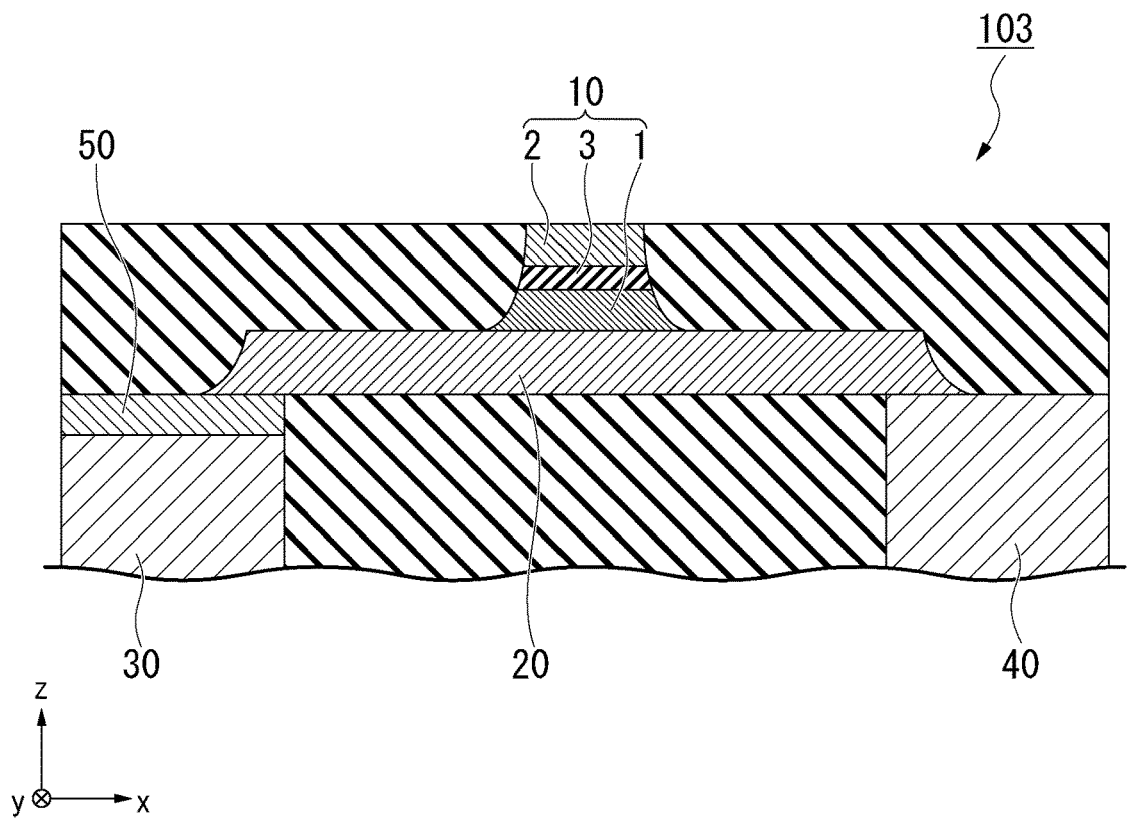
FIG. 9 is a cross-sectional view of a spin element according to a third modified example.

FIG. 9 is a cross-sectional view of a magnetoresistance effect element 103 according to a third modified example. FIG. 9 shows a cross section of the magnetoresistance effect element 103 cut along an xz plane that passes through the center of the width of the wiring 20 in the y direction.

The magnetoresistance effect element 103 according to the third modified example is different from the magnetoresistance effect element 100 according to the first embodiment in that there is no second intermediate layer 60 between the second conductive part 40 and the wiring 20. The first intermediate layer 50 prevents diffusion of elements between the wiring 20 and the first conductive part 30.

Second Embodiment

Figure 10:
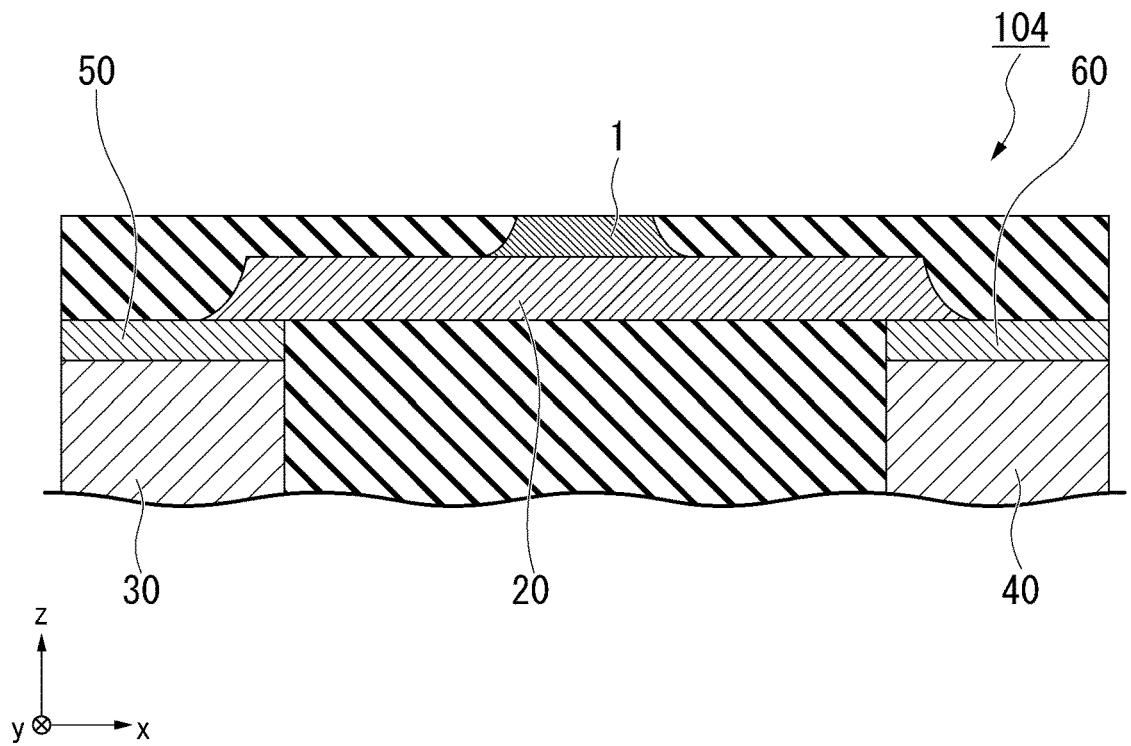
FIG. 10 is a cross-sectional view of a spin element according to a second embodiment.

FIG. 10 is a cross-sectional view of a magnetization rotating element 104 according to a second embodiment. FIG. 10 shows a cross section of the magnetoresistance effect element 100 cut along an xz plane that passes through the center of the width of the wiring 20 in the y direction. The magnetization rotating element 104 according to the second embodiment is different from the magnetoresistance effect element 100 according to the first embodiment in that it does not include the nonmagnetic layer 3 and the second ferromagnetic layer 2. The other components are the same as those of the magnetoresistance effect element 100 according to the first embodiment, and descriptions thereof will be omitted.

The magnetization rotating element 104 is an example of a spin element. For example, the magnetization rotating element 104 allows light to enter the first ferromagnetic layer 1 and evaluates light reflected at the first ferromagnetic layer 1. When the orientation direction of the magnetization varies due to the magnetic Kerr effect, the deflection state of the reflected light varies. For example, the magnetization rotating element 104 can be used as an optical element, for example, a video display device, using a difference in the light deflection state.

In addition, the magnetization rotating element 104 alone can be used as an anisotropic magnetic sensor, an optical element using the magnetic Faraday effect, or the like.

In the magnetization rotating element 104 according to the second embodiment, only the nonmagnetic layer 3 and the second ferromagnetic layer 2 are removed, and the same effects as in the magnetoresistance effect element 100 according to the first embodiment can be obtained. In addition, the same modified example as the magnetoresistance effect element 100 according to the first embodiment can be selected.

Third Embodiment

Figure 11:
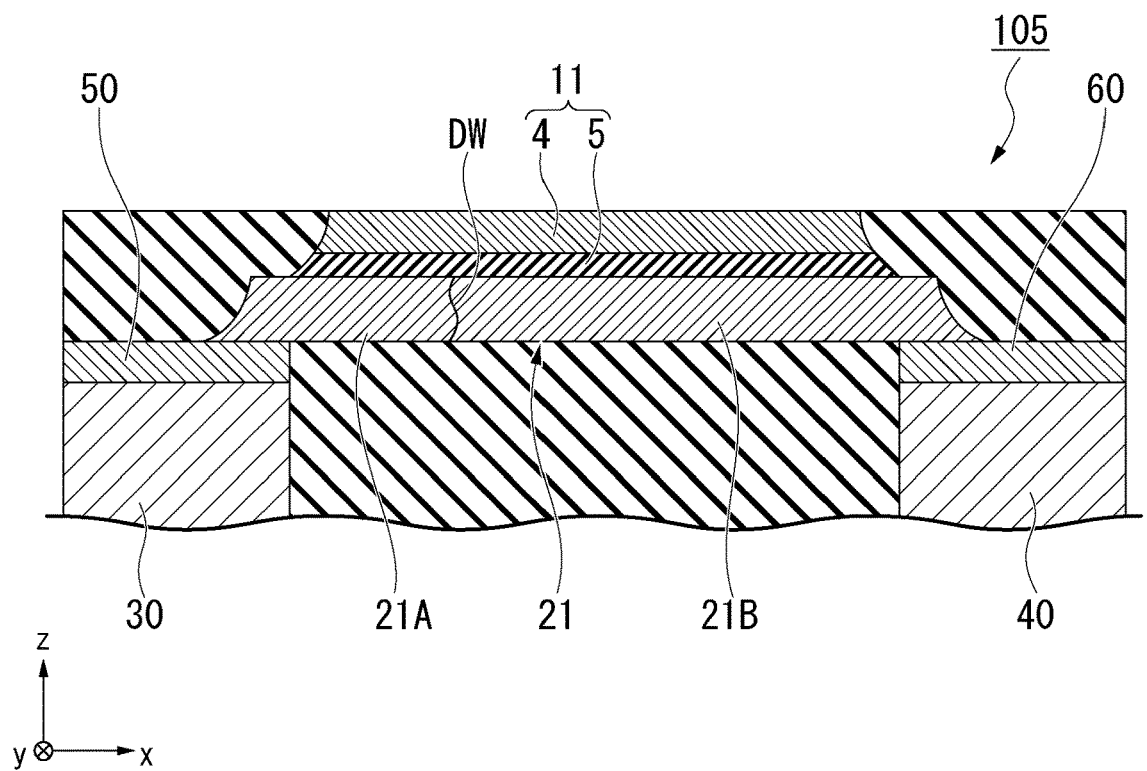
FIG. 11 is a cross-sectional view of a spin element according to a third embodiment.

FIG. 11 is a cross-sectional view of a magnetoresistance effect element 105 according to a third embodiment. FIG. 11 shows a cross section of the magnetoresistance effect element 105 cut along an xz plane that passes through the center of the width of a wiring 21 in the y direction. The magnetoresistance effect element 105 is different from the magnetoresistance effect element 100 in that a laminate 11 includes a nonmagnetic layer 5 and a first ferromagnetic layer 4 from the side closer to the wiring 21. The same components as those of the magnetoresistance effect element 100 will be denoted with the same reference numerals and descriptions thereof will be omitted.

The magnetoresistance effect element 105 includes the laminate 11, the wiring 21, the first conductive part 30, the second conductive part 40, the first intermediate layer 50, and the second intermediate layer 60. The laminate 11 includes the nonmagnetic layer 5 and the first ferromagnetic layer 4 from the side closer to the wiring 21. The magnetoresistance effect element 105 is an element whose resistance value varies when the magnetic domain wall DW moves, and may be referred to as a magnetic domain wall moving element or a magnetic domain wall moving type magnetoresistance effect element.

The wiring 21 is a magnetic layer. The wiring 21 contains a ferromagnetic material. The main element constituting the wiring 21 is a first element. Regarding the magnetic material constituting the wiring 21, a metal selected from the group consisting of Cr, Mn, Co, Fe and Ni, an alloy containing one or more of these metals, an alloy containing such a metal and at least one or more elements of B, C, and N, or the like can be used. Specific examples thereof include Co—Fe, Co—Fe—B, and Ni—Fe. For example, when the wiring 21 is expressed as $Co_{0.5}Fe_{0.5}$ and the proportions of Co and Fe are the same, either element is set as the first element.

The wiring 21 is a layer in which information can be magnetically recorded due to the change in the internal magnetic state. The wiring 21 includes a first magnetic section 21A and a second magnetic section 21B therein. For example, the magnetization of the first magnetic section 21A and the magnetization of the second magnetic section 21B are directed in opposite directions. The boundary between the first magnetic section 21A and the second magnetic section 21B is the magnetic domain wall DW. The wiring 21 is capable of having the magnetic domain wall DW therein.

The magnetoresistance effect element 105 can record data in multiple levels or continuously depending on the position of the magnetic domain wall DW of the wiring 21. The data recorded in the wiring 21 is read as a change in the resistance value of the magnetoresistance effect element 105 when a read current is applied.

The magnetic domain wall DW moves when a write current flows through the wiring 21 in the x direction or an external magnetic field is applied. For example, when a write current (for example, a current pulse) is applied to the wiring 21 in the +x direction, since electrons flow in the −x direction opposite to that of the current, the magnetic domain wall DW moves in the −x direction. When a current flows from the first magnetic section 21A toward the second magnetic section 21B, electrons spin-polarized in the second magnetic section 21B reverses the magnetization of the first magnetic section 21A. When the magnetization of the first magnetic section 21A is reversed, the magnetic domain wall DW moves in the −x direction.

The first ferromagnetic layer 4 and the nonmagnetic layer 5 are the same as the first ferromagnetic layer 1 and the nonmagnetic layer 3 according to the first embodiment, respectively.

The magnetoresistance effect element 105 according to the third embodiment can obtain the same effects as the magnetoresistance effect element 100 according to the first embodiment. In addition, the same modified example as the magnetoresistance effect element 100 according to the first embodiment can be selected.

Fourth Embodiment

Figure 12:
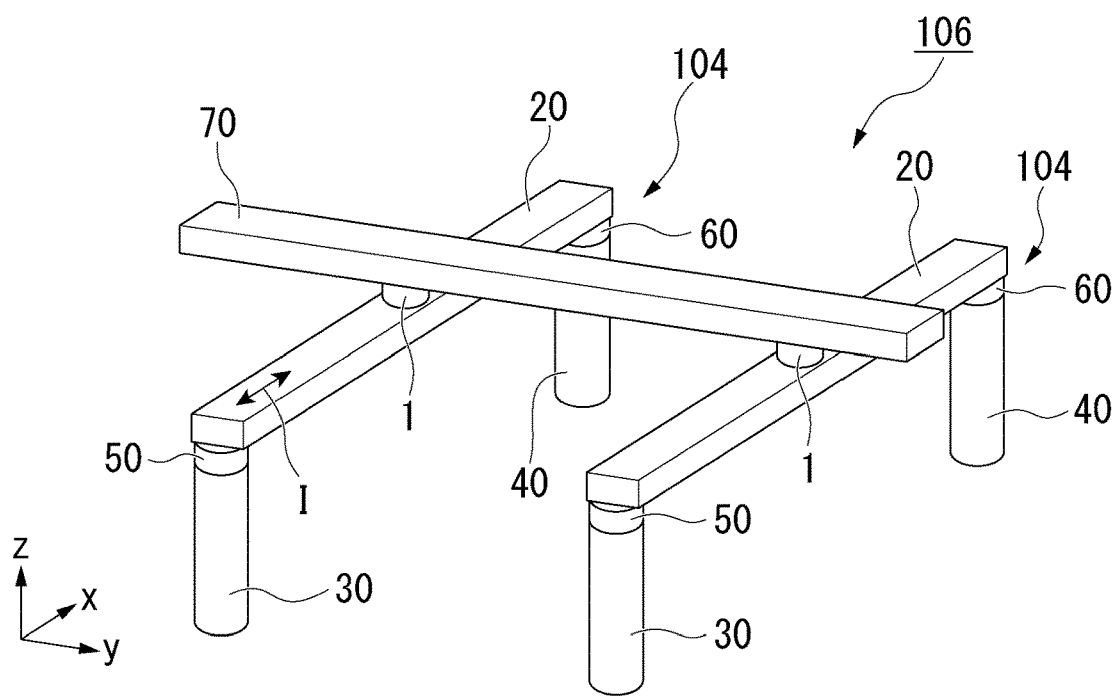
FIG. 12 is a perspective view of a reservoir element according to a fourth embodiment.

FIG. 12 is a perspective view of a reservoir element 106 according to a fourth embodiment. The reservoir element 106 includes a plurality of magnetization rotating elements 104 and a spin conduction layer 70 that connects between the first ferromagnetic layers 1 of the plurality of magnetization rotating elements 104. The spin conduction layer 70 is composed of, for example, a nonmagnetic conductor. The spin conduction layer 70 propagates a spin current leaked from the first ferromagnetic layer 1.

The reservoir element is an element used in a reservoir computer which is one of neuromorphic elements. The neuromorphic element is an element that imitates the human brain with a neural network. The neuromorphic element is used, for example, as a recognizer. For example, the recognizer recognizes an input image (image recognition) and classifies it.

The reservoir element 106 converts an input signal that is input into another signal. In the reservoir element 106, signals only interact and do not learn. When input signals interact with each other, the input signals change nonlinearly. That is, the input signal is replaced with another signal while maintaining the original information. The input signals interact with each other in the reservoir element 106 and thus change over time. In the reservoir element 106, the first ferromagnetic layers 1 corresponding to the plurality of neurons are connected to each other. Therefore, for example, a signal output from a neuron at a certain time t may return to the original neuron at a certain time t+1. The neuron can perform processing based on signals at a time t and a time t+1 and can recursively process information.

The spin conduction layer 70 is, for example, a metal or a semiconductor. A metal used for the spin conduction layer 70 is, for example, a metal containing any element selected from the group consisting of Cu, Ag, Al, Mg, and Zn or an alloy thereof. A semiconductor used for the spin conduction layer 70 is, for example, any single element selected from the group consisting of Si, Ge, GaAs, and C or an alloy thereof. Examples thereof include Si, Ge, a Si—Ge compound, GaAs, and graphene.

When a current I flows through the wiring 20, a spin is injected into the first ferromagnetic layer 1, and a spin orbit torque is applied to the magnetization of the first ferromagnetic layer 1. When a high frequency current is applied to the wiring 20, directions of spins injected into the first ferromagnetic layer 1 change, and the magnetization of the first ferromagnetic layer 1 vibrates.

The spin current reaches from the first ferromagnetic layer 1 to the spin conduction layer 70. Since the magnetization of the first ferromagnetic layer 1 vibrates, a spin current flowing through the spin conduction layer 70 also vibrates according to the magnetization. Spins accumulated at an interface between the first ferromagnetic layer 1 and the spin conduction layer 70 propagate as a spin current in the spin conduction layer 70.

Spin currents generated by the magnetizations of two first ferromagnetic layers 1 merge in the spin conduction layer 70 and interfere therewith. The interference of the spin currents affect vibration of the magnetization of each of the first ferromagnetic layers 1 and the vibration of the magnetizations of the two first ferromagnetic layers 1 resonate. Phases of vibrations of two magnetizations are synchronized or shifted by a half wavelength ($\pi$).

When application of a current I to the wiring 20 is stopped, the vibration of the magnetization of the first ferromagnetic layer 1 is stopped. The magnetizations of the first ferromagnetic layers 1 after resonance are parallel or anti-parallel. When phases of two vibrations are synchronized, directions of the two magnetizations are aligned and parallel. When phases of the two vibrations are shifted by a half wavelength ($\pi$), directions of the two magnetizations are opposite directions and anti-parallel.

When the magnetizations of the two first ferromagnetic layers 1 are parallel to each other, the resistance value of the reservoir element 106 is smaller than when the magnetizations thereof are anti-parallel. For example, the reservoir element 106 outputs information of "1" when the resistance value of the reservoir element 106 is large (the two magnetizations are anti-parallel) and outputs information of "0" when the resistance value thereof is small (the two magnetizations are parallel).

The current I input to the wiring 20 includes various pieces of information. Examples thereof include a frequency, a current density, and a current amount of the current I. On the other hand, the reservoir element 106 outputs information of "1" or "0" as a resistance value. That is, the reservoir element 106 according to the first embodiment converts vibrations of magnetizations of a plurality of first ferromagnetic layers 1 into the spin currents, which interfere with each other in the spin conduction layer 70, and thus converts information.

The reservoir element 106 according to the fourth embodiment can obtain the same effects as the magnetoresistance effect element 100 according to the first embodiment. In addition, the same modified example as the magnetoresistance effect element 100 according to the first embodiment can be selected.

While preferable embodiments of the present invention have been provided above as exemplary examples based on the first embodiment to the fourth embodiment, the present invention is not limited to these embodiments. For example, feature configurations in respective embodiments may be applied to other embodiments.

REFERENCE SIGNS LIST 1, 4 First ferromagnetic layer
2 Second ferromagnetic layer
3, 5 Nonmagnetic layer
10, 11 Laminate
20, 21 Wiring
20a First surface
20b Second surface
21A First magnetic section
21B Second magnetic section
30 First conductive part
40 Second conductive part
50, 51, 52 First intermediate layer
60, 61, 62 Second intermediate layer
70 Spin conduction layer
90, 91, 92 Insulating layer
100, 101, 102, 103, 105 Magnetoresistance effect element
104 Magnetization rotating element
106 Reservoir element
110 First switching element
120 Second switching element
130 Third switching element
200 Magnetic recording array
C1, C2, C3, C4 Center
Cm1 to Cmn Common wiring
Cw Conductive part
D Drain
E Conductive layer
G Gate electrode
GI Gate insulation film
Rp1 to Rpn Read wiring
S Source
Sub Substrate
Tr Transistor
Wp1 to Wpn Write wiring

What is claimed is:

1. A spin element, comprising:
a wiring;
a laminate including a first ferromagnetic layer laminated on the wiring;
a first conductive part and a second conductive part with the first ferromagnetic layer therebetween in a plan view in a lamination direction; and
a first intermediate layer which is in contact with the wiring and is between the first conductive part and the wiring,
wherein a diffusion coefficient of a second element including the first intermediate layer with respect to a first element including the wiring is smaller than a diffusion coefficient of a third element including the first conductive part with respect to the first element, or
a diffusion coefficient of the third element with respect to the second element is smaller than a diffusion coefficient of the third element with respect to the first element.

2. The spin element according to claim 1,
wherein the first element, the second element and the third element are elements that are different from each other, wherein the first element is one selected from the group consisting of Au, Hf, Mo, Pt, W, and Ta,
wherein the second element is one selected from the group consisting of Co, Al, Ag, Au, Mo, Hf, Pt, W, and Ta, and
wherein the third element is one selected from the group consisting of Ag, Cu, Co, Al, and Au.

3. A spin element, comprising:
a wiring;
a laminate including a first ferromagnetic layer laminated on the wiring;
a first conductive part and a second conductive part with the first ferromagnetic layer therebetween in a plan view in a lamination direction; and
a first intermediate layer which is in contact with the wiring between the first conductive part and the wiring,
wherein the wiring contains one selected from the group consisting of Au, Hf, Mo, Pt, W, and Ta as a first element,
wherein the first intermediate layer contains a second element,
wherein the first conductive part contains a third element,
wherein, when the first element is Au and the third element is Cu, the second element is one selected from the group consisting of Ag, Co, and Hf,
wherein, when the first element is Au and the third element is Ag, the second element is Co or Hf,
wherein, when the first element is Au and the third element is Co, the second element is Hf,
wherein, when the first element is Hf and the third element is Co, the second element is Al,
wherein, when the first element is Mo and the third element is Co, the second element is W,
wherein, when the first element is Pt and the third element is Al, the second element is one selected from the group consisting of Au, Ag, and Co,
wherein, when the first element is Pt and the third element is Au, the second element is Ag or Co,
wherein, when the first element is Pt and the third element is Ag, the second element is Co,
wherein, when the first element is Ta and the third element is Al, the second element is Hf,
wherein, when the first element is W and the third element is Co, the second element is one selected from the group consisting of Hf and Mo,
wherein, when the first element is Au and the third element is Ag, the second element is Pt,
wherein, when the first element is Au and the third element is Co, the second element is one selected from the group consisting of Pt, Mo, and W,
wherein, when the first element is Hf and the third element is Co, the second element is one selected from the group consisting of Au, Pt, Mo and W,
wherein, when the first element is Mo and the third element is Co, the second element is W,
wherein, when the first element is Pt and the third element is Al, the second element is Ta or Hf,
wherein, when the first element is Pt and the third element is Co, the second element is Mo or W, and
wherein, when the first element is Ta and the third element is Al, the second element is Hf.

4. The spin element according to claim 1,
wherein a circumferential length of the first intermediate layer is smaller than a circumferential length of the first conductive part, and
wherein, in a plan view in the lamination direction, the first intermediate layer is included in the first conductive part.

5. The spin element according to claim 1,
wherein the circumferential length of the first intermediate layer is smaller than the circumferential length of the first conductive part, and
wherein, in a plan view in the lamination direction, a distance between a geometrical center of the first intermediate layer and a geometrical center of the first ferromagnetic layer is shorter than a distance between a geometrical center of the first conductive part and the geometrical center of the first ferromagnetic layer.

6. The spin element according to claim 1,
wherein a side surface of the first intermediate layer and a side surface of the first conductive part are continuous.

7. The spin element according to claim 1,
wherein the wiring has a circumferential length that increases from a first surface on the side of the first ferromagnetic layer toward a second surface opposite to the first surface.

8. The spin element according to claim 1,
wherein, in a second direction orthogonal to a first direction in which the wiring extends and the lamination direction, a width of the wiring is narrower than a width of the first intermediate layer in the second direction.

9. The spin element according to claim 1,
wherein a second intermediate layer which is in contact with the wiring and is between the second conductive part and the wiring, and
wherein a diffusion coefficient of a fifth element including the second intermediate layer with respect to the first element is smaller than a diffusion coefficient of a fourth element including the second conductive part with respect to the first element,
or a diffusion coefficient of the fourth element with respect to the fifth element is smaller than a diffusion coefficient of the fourth element with respect to the first element.

10. The spin element according to claim 1,
wherein the laminate includes the first ferromagnetic layer, and
wherein the wiring is any one of a metal, an alloy, an intermetallic compound, a metal boride, a metal carbide, a metal silicide, and a metal phosphide which have a function of generating a spin current due to the spin Hall effect when a current flows.

11. The spin element according to claim 1,
wherein the laminate includes the first ferromagnetic layer, a nonmagnetic layer, and a second ferromagnetic layer from the side closer to the wiring, and
wherein the wiring is any one of a metal, an alloy, an intermetallic compound, a metal boride, a metal carbide, a metal silicide, and a metal phosphide which have a function of generating a spin current due to the spin Hall effect when a current flows.

12. The spin element according to claim 10,
wherein a shortest distance between the first intermediate layer and the first ferromagnetic layer is 5 times a spin diffusion length of the first element or less.

13. The spin element according to claim 10,
wherein plus or minus signs of spin Hall angles of the first element and the second element are the same.

14. The spin element according to claim 1,
wherein the laminate contains a nonmagnetic layer and the first ferromagnetic layer from the side closer to the wiring, and
wherein the wiring is a ferromagnetic layer that is capable of having a magnetic domain wall therein.

15. A reservoir element, comprising:
a plurality of spin elements according to claim 10; and
a spin conduction layer that connects between the first ferromagnetic layers of the plurality of spin elements.

16. The spin element according to claim 3,
wherein the circumferential length of the first intermediate layer is smaller than the circumferential length of the first conductive part, and
wherein, in a plan view in the lamination direction, a distance between a geometrical center of the first intermediate layer and a geometrical center of the first ferromagnetic layer is shorter than a distance between a geometrical center of the first conductive part and the geometrical center of the first ferromagnetic layer.

17. The spin element according to claim 3,
wherein, in a second direction orthogonal to a first direction in which the wiring extends and the lamination direction, a width of the wiring is narrower than a width of the first intermediate layer in the second direction.

18. The spin element according to claim 3,
wherein a second intermediate layer which is in contact with the wiring and is between the second conductive part and the wiring, and
wherein a diffusion coefficient of a fifth element including the second intermediate layer with respect to the first element is smaller than a diffusion coefficient of a fourth element including the second conductive part with respect to the first element,
or a diffusion coefficient of the fourth element with respect to the fifth element is smaller than a diffusion coefficient of the fourth element with respect to the first element.

19. The spin element according to claim 3,
wherein the laminate includes the first ferromagnetic layer, and
wherein the wiring is any one of a metal, an alloy, an intermetallic compound, a metal boride, a metal carbide, a metal silicide, and a metal phosphide which have a function of generating a spin current due to the spin Hall effect when a current flows.

20. The spin element according to claim 3,
wherein the laminate includes the first ferromagnetic layer, a nonmagnetic layer, and a second ferromagnetic layer from the side closer to the wiring, and
wherein the wiring is any one of a metal, an alloy, an intermetallic compound, a metal boride, a metal carbide, a metal silicide, and a metal phosphide which have a function of generating a spin current due to the spin Hall effect when a current flows.

* * * * *